United States Patent [19]
Bredin et al.

[11] Patent Number: 5,204,560
[45] Date of Patent: Apr. 20, 1993

[54] COMBINED SENSE AMPLIFIER AND LATCHING CIRCUIT FOR HIGH SPEED ROMS

[75] Inventors: Francis Bredin, Maisons Alfort; Thierry Cantiant, Dammarie-Les-Lys; Pierre Coppens, Savigny-Le-Temple, all of France

[73] Assignee: International Business Machines Corporation, Armonk, N.Y.

[21] Appl. No.: 771,669

[22] Filed: Oct. 4, 1991

[30] Foreign Application Priority Data

Mar. 29, 1991 [EP] European Pat. Off. ........ 91480053.7

[51] Int. Cl.⁵ .................... H03F 3/45; H03K 5/153
[52] U.S. Cl. .................... 307/530; 307/290; 307/363; 307/279; 307/360; 305/272.2; 365/205; 365/189.09
[58] Field of Search ........... 307/530, 290, 363, 279, 307/360, 272.2; 365/205-208, 189.09

[56] References Cited

U.S. PATENT DOCUMENTS

| | | | |
|---|---|---|---|
| 3,636,527 | 1/1972 | Zuk | 340/173 FF |
| 4,804,865 | 2/1989 | Clark, II | 307/297 |
| 4,837,465 | 6/1989 | Rubinstein | 307/272.2 |
| 4,897,568 | 1/1990 | Chern et al. | 365/207 |
| 5,003,511 | 3/1991 | Secol et al. | 365/189.09 |
| 5,023,480 | 6/1991 | Gieseke et al. | 307/530 |

FOREIGN PATENT DOCUMENTS 0180001 5/1986 European Pat. Off. .

OTHER PUBLICATIONS

"Level-Sensitive Scan Design tests chips, boards, system" Berglund, Electronics/Mar. 15, 1979, pp. 108-110.
IBM Disc. Bul. vol. 17 No. 1, Jun. 1974, "Low-input impedance FET (or Bi-FET) sense amplifier" Cassidy et al.

Primary Examiner—William L. Sikes
Assistant Examiner—M. Wambach
Attorney, Agent, or Firm—Harold Huberfeld

[57] ABSTRACT

A combined sense amplifier and latching circuit receives an input signal (VIN) at an input terminal (22). A sense amplifier includes a gated-loop type master latch (ML) having two cascaded inverters (I12, I13) with a common node (I) coupled therebetween and a control device (TG4) in the master latch loop controlled by a gating signal (SSA). A reference voltage generator generates a reference voltage (VREF). The two inverters are biased between a first supply voltage (Vdd) having a magnitude greater than the reference voltage and either a second supply voltage (GND) or the reference voltage depending on the value of the gating signal. The input terminal is connected to the input of one of the inverters. A gated-loop slave latch (SL) is connected in series with the sense amplifier and includes two cascaded inverters (I14, I15) with a common node (M) coupled therebetween and a control device (P15) in the slave latch loop controlled by the gating signal. The sense amplifier and the slave latch are isolated from each other by a control device (TG5) controlled by the gating signal.

12 Claims, 6 Drawing Sheets

COMBINED SENSE AMPLIFIER AND LATCHING CIRCUIT FOR HIGH SPEED ROMS

BACKGROUND IF THE INVENTION

The present invention relates to the sensing of integrated memory circuits, typically Read Only Memories (ROMs), and more particularly to a combined sense amplifier and latching circuit that has high growability and porosity capabilities.

The problem is to read the data contained in a ROM array which may be built out of a 2-dimension matrix of cells, each comprised of one transistor, connected to a series of bit lines (BLs) arranged in columns. Conventionally, a sense amplifier senses the bit line of a column to read the data stored in the selected transistor. With standard sense amplifiers, the data out is not valid during the whole period between two READ operations, and in particular, at the beginning of the access cycle, when the sense amplifier output node is restored to the most positive voltage. Should the data out be required valid at any time, a latch circuit should be added to the sense amplifier. In addition, such a latch circuit becomes absolutely necessary, when the sense circuitry must comply with LSSD rules which require a latched data out. LSSD (Level Sensitive Scan Design) is a test technique that was invented by E. B. Eichelberger and described in U.S. Pat. Nos. 3,783,254, 3,784,907 and 3,961,252 assigned to the assignee of the present invention. This test technique permits every functional element (e.g. a circuit entity or macro such as a RAM, a ROM, an ALU, ... embedded in a semiconductor chip) to be completely tested and even allows a complex system or the whole machine to be diagnosed at a customer's site by a field-service engineer. A comprehensive survey of the LSSD technique is given in an article entitled "Level-Sensitive Scan Design tests Chips, Boards, Systems" by Neil C. Berglun published in Electronics, Mar. 15, 1979, pp. 108–110.

A LSSD chip comprises several logic blocks, each of which is associated with a storage cell typically a Shift Register Latch (SRL). A single long shift register termed an "LSSD chain" is formed by chaining a number of such SRLs. Each SRL consists of a pair of bistable latches designated L1 and L2.

The L1 latch can be set, one of two inputs, chosen by pulsing one of two different clock signals Ac and Cc, the latter being derived from the system clock signal. Latch L1 also has a data input, called Data In (DI) and a test input called Scan Data In (SDI or SI). Latch L2 has a data input connected to one of the outputs of the associated L1 latch, which receives the Bc clock signal causing the output data or data out (DO) stored in the L1 latch to be transferred into the L2 latch.

The long shift register mentioned above is formed by connecting the output of the L2 latch of the first SRL (therefore forming the first stage of LSSD chain) to the input of the L1 latch of the next SRL, and so on, till the last SRL is connected. The test input SI of the L1 latch in the first SRL is connected to the SI input, or main SI input, of the chip. Test patterns consisting of binary words are applied to the main SI input of the chip. The output of the L2 latch in the last SRL is connected to a Scan Data Out (SDO or SO) output, or main SO output of the chip. The Ac, Bc and Cc clock signals of each SRL are connected to their respective inputs on the chip. Obviously, the "chain" concept is also applicable to functional elements of the same type or of different types.

It should be noted, that while the latches forming the LSSD chains may represent as much as 10% of the surface area of a logic chip, most of these are used to implement the normal system function.

Data is transferred through the SRL in two steps. A binary data applied to the test input Si of latch L1 is first loaded therein by the Ac clock pulse. At the occurrence of the Bc clock pulse, the data becomes available at the output of the L2 latch. A number of pairs of Ac and Bc clock pulses equivalent to the number of SRLs is therefore required in an appropriate sequence to transfer the data to the SO main output of the functional element. In this mode of operation, clock signal Cc is not active.

FIG. 1A shows a typical sensing circuit scheme referenced 10 of the prior art that provides a latched data out to fully comply with LSSD rules.

Now turning to FIG. 1A, circuit 10 basically comprises five blocks: a multiplexer 11, a restore circuit 12, a sense amplifier 13 and first and second LSSD latch circuits 14 and 15. Broadly, latch circuits 14 and 15 respectively correspond to latches L1 and L2 mentioned above. Multiplexer 11 has a conventional structure with four Positive Field-Effect Transistors (PFETs) P1 to P4, with each gate electrode controlled respectively by a corresponding control signal, BS1 to BS4. Each source region of PFETs P1 to P4 is respectively connected to a bit line, BL1 to BL4, while their drain, regions are connected at node A. The interconnection line between node A and the input terminal 16 of sense amplifier 13 is referred to as the data line DL. A restore circuit 12 which simply consists of PFET P5 is connected between node A and a first supply voltage Vdd for restoring node A to a high state. The RESTORE signal, RST, is applied to the gate electrode of PFET P5.

Sense amplifier 13 essentially consists of a double-ended gated latch formed by two inverters I1 and I2 respectively constituted by FET devices P6 and N1 for inverter I1 and P7 and N2 for inverter I2. The inverters I1 and I2 are appropriately cross-coupled in a standard manner, and combined with a gating circuit formed by inverter I3, to form the latch referred to as the sense amplifier latch SAL with internal nodes B and C. The source regions of PFETs P6 and P7 are tied to the first supply voltage Vdd. The source regions of Negative Field-Effect Transistors (NFETs) N1 and N2 are connected to the common node D of the inverter I3 consisting of FET devices P8 and N3. Inverter I3 is connected between the first supply voltage Vdd and a second supply voltage, usually the ground GND. Inverter I3 is driven by a Sense Amplifier Enable (SAE) signal and operates as the gating circuit to connect node D either to Vdd (to render latch SAL inoperative) or to GND (to set the latch), depending on the level of the SAE signal. Nodes B and C are connected respectively to the data line DL and to Vdd through access PFETs P9 and P10. Both PFETs P9 and P10 have their gate electrodes driven by the SAE signal. PFETs P9 and P10 are typical of the double-ended structure of sense amplifier 13. Such sense amplifiers are often implemented in present high performance designs, because when built with large FET devices they can operate at high speeds.

Optionally, sense amplifier 13 further includes two output drivers formed by inverters I4 and I5. They are each formed from a pair of large complementary FET devices. The IN PHASE Vout and OUT OF PHASE Vout output signals are respectively available at terminals 17 and 17' of sense amplifier 13. The OUT OF PHASE signal may not be required by inverter I5 but is nevertheless required to balance the effect of inverter I4 on latch SAL.

The LSSD data out latch circuits 14 and 15 are conventional circuits. Their respective input terminals are referenced 18 and 18' and generate the +L1 and +L2 data out signals at respective output terminals 19 and 19'. In addition, they also respectively deliver the Scan Data In (SI) and Scan Data Out (SO) signals mentioned above. The first latch circuit 14 includes a transmission gate TG1 controlled by the Cc/Cc clock signals, connected between input terminal 18 and a gated-loop latch L1 at node E. The gated-loop latch L1 basically consists of two inverters I6 and I7 with node F coupled therebetween and a loop controlled by PFET P11 whose gate electrode is driven by either the Ac or the Cc clock signal. First latch circuit 14 further includes the Scan Data In (SI) signal generating circuit connected at node E, which simply consists of transmission gate TG2 controlled by the Ac/Ac clock signals. Usually, an inverter I8, connected to node F, is the output buffer which supplies the +L1 data out signal at output terminal 19. The second latch circuit 15 is similar in construction. The transmission gate TG3 is connected between input terminal 18' and the gated loop latch L2 at node G. It is controlled by the Bc/Bc clock signals. The gated loop latch L2 consists of inverters I9 and I10 connected in series with node H coupled therebetween. PFET P12 in the loop is controlled by the Bc clock signal. Optionally, inverter I11 coupled to node H supplies the +L2 data out signal at terminal 19'. As is apparent from FIG. 1A the Scan Data Out (SO) signal is also available at the output of inverter I10. Additional inverters generate the complementary clock signals (Ac, Bc, Cc) that are required for an adequate operation of circuit 10 of FIG. 1A.

FIG. 1B shows the schematic block diagram of the circuit. It is simplified representation of FIG. 1A. Switching devices including inverters and transmission gates are represented by switches with their respective gating/clocking signals. In FIG. 1B, the Scan Data In circuit has been removed from the latch circuit 14, making more apparent that the LSSD latch circuits 14 and 15 have the same basic hardware construction.

Let us now briefly explain the global functionality of circuit 10 of FIGS. 1A/1B during a READ operation in conjunction with FIG. 1C which shows the waveforms at different nodes/terminals of circuit 10. One out of four PFETs P1 to P4 is activated, by one of the control signals BS1 to BS4 provided by the bit line decoder circuit (not represented). Thus, the input signal of the selected bit line is applied to sense amplifier 13 via the activated PFET and data line DL. The potential on the data line DL is sensed through PFET P9 and compared to the supply voltage Vdd through PFET P10. Two cases must be considered depending on whether the value of the binary data stored in the ROM cell or transistor is a "0" or "1":

1. Assuming the value of the data is "0", under control of the system clock (which has selected a word line), the potential of data line DL drops from voltage Vdd to a lower potential. At the transition of the SAE signal to a negative slope (also derived from the system clock), PFETs P9 and P10 are rendered conductive, thus the potential of node B decreases. While the potential of node C remains at voltage Vdd. At this moment, the Vout signal is not representative of valid data. When the SAE signal increases again, PFETs P9 and P10 turn OFF and NFET N3 turns ON, thus setting the sense amplifier latch SAL. As a result, the potential of the B and D nodes go to the ground potential through NFETs N1 and N3 respectively, while the C node remains at voltage Vdd because PFET P7 is ON and PFETs P8 and P6 are OFF. The sense amplifier latch SAL stores the "0" and the Vout signal is at ground. At the transition of clock signal Cc to a positive slope, the "0" is transferred to latch L1 via the transmission gate TG1. As is apparent from the left part of FIG. 1C, the L1 signal and the Vout signal are at the potential of ground (0 Volt).

2. Assuming the value of the data is "1", the potential of the data line DL remains high at voltage Vdd. After setting the sense amplifier latch SAL by the transition of the SAE signal to a negative slope, both B and C nodes still remain at voltage Vdd. When the SAE signal rises, the potential of node D goes to ground through NFET N3. Because the NFET N2 channel length is designated to be shorter than that of N1, the C node will be pulled down to the ground faster than the B node. The B node is held to voltage Vdd through PFET P6. Note by the way, that NFETs N1 and N2 must have different sizes for correct operation. The Vout signal is held at voltage Vdd. At the transition of clock signal Cc to a positive slope, the "1" is transferred to latch L1. As is apparent from 1C, the L1 and Vout signals are at the potential of Vdd after the clock signal Cc reaches its maximum value.

Thus, in both cases, when the SAE signal has increased to its maximum value, the data is latched in the sense amplifier latch SAL. The rising edge of the Cc clock signal transfers the data in latch L1. During the RESTORE mode, which starts immediately after the rising edge of the SAE signal, the potential of the data line DL is restored to voltage Vdd via PFET P5 under control of the RST signal, while the data out is transferred from the sense amplifier latch SAL to the latch L1. Finally, irrespective of whether the value of the data is a "1" or a "0", the data out is transferred from latch L1 to latch L2 at the rising edge of clock signal Bc.

However, although circuit 10 of FIGS. 1A/1B is implemented with a potentially high performance sense amplifier, it exhibits several disadvantages.

First of all, it is very difficult to adjust the gating of sense amplifier 13 and L1 latch circuit 14, because there are three gating/clocking signals, SAE, Ac and Cc as clearly apparent from FIG. 1B. Should growability be required, it would be therefore necessary to have different macros or books (the circuit including the ROM array and the control circuits thereof such as sense amplifier latches decoders, ... etc.) in the macro/book library, to adapt gating/clocking signal distribution for each macro.

By growability, it is meant the ability of a circuit to adapt to different sizes and specifications as required by the user's application.

Secondly, sense amplifier latch. SAL, to attain high performance, must have a high gain, therefore requiring the use of large devices. It is known that use of large devices result in a bad noise immunity, in other words making the latch SAL too sensitive to porosity. By porosity, it is meant effects due to coupling between signal lines passing above the circuit. As a matter of fact, large devices are known to have a small threshold voltage (e.g. PFET P7 which is a large device has a VT of about 0.3 V), thereby reducing the noise margin, and finally vulnerable to porosity. On the other hand, these large devices must be adjustable for adaptation to the size of a determined ROM macro, and therefore also severely constrain growability.

Moreover, the sense amplifier latch SAL is very sensitive to process misalignment because NFETs N1 and N2 must have different sizes (i.e. different widths W or lengths L). Because NFET N1 must be slower than NFET N2, it must have a smaller width or a larger length. Should the N1 channel length be made shorter than that of N2 during the manufacturing process, NFET N1 would become faster than NFET N2. As a result, in the case where both nodes B and C are held to voltage Vdd as is possible when a "1" is to be read as explained above, the latch will switch in the wrong direction and store false data. In addition, the SAE gating signal, simultaneously drives devices of different types. For example, PFET P9 and NFET N3 have to be simultaneously driven, but they operate at different speeds due to the different mobility of their carriers. Because the sense amplifier latch SAL of FIG. 1A operates with signal transitions at the time of set up, an accurate control of these devices is not easy.

Finally, for all the reasons mentioned above, circuit 10 is not appropriate, in particular for growability and for porosity constraints, that are required for modern sense amplifiers complying with LSSD rules. In addition, its potential from a performance point of view cannot be fully exploited due to its high gain; the noise margin reduction that would result from this high gain would be unacceptable.

OBJECTS OF THE INVENTION

It is therefore a primary object of the present invention to provide a combined sense amplifier and latching circuit that complies with LSSD requirements.

It is another object of the present invention to provide a combined sense amplifier and latching circuit which is tolerant to process misalignment for a better functionality and robustness.

It is another object of the present invention to provide a combined sense amplifier and latching circuit which operates with a simplified clocking distribution scheme for accurate clock control and growability.

It is another object of the present invention to provide a combined sense amplifier and latching circuit which does not imply macro size dependent devices for improved growability.

It is still another object of the present invention to provide a combined sense amplifier and latching circuit which has a high noise immunity to avoid potential limitations in users' applications and reduced sensitivity to porosity.

It is still a further object of the present invention to provide a combined sense amplifier and latching circuit which can be implemented with small FET devices and a reduced number thereof.

SUMMARY OF THE INVENTION

The combined sense amplifier and latching circuit of the present invention includes two gated-loop latches connected in series forming two stages in a master-slave like configuration. The first stage comprises the master latch and combines the function of the previous sense amplifier and the function of the standard L1 latch. The master latch alternately plays each role. More specifically, the master latch is of the standard gated-loop type, formed by two cascaded inverters with a first control device in the loop. The second stage comprises the slave latch, which is also a standard gated-loop latch formed by two cascaded inverters with a second control device in the loop. The two main and slave latches connected in series are isolated by a third control device. Typically, inverters are made by a pair of complementary FET devices connected in series. In the master latch, the free ends of the PFET devices are connected to a first supply voltage (Vdd), the free ends of the NFET devices are connected to form a common node that is coupled to a reference voltage generator. The reference voltage generator allows the common node to be connected either to a second supply voltage (the ground GND) or to a reference voltage (VREF) which is at a lower voltage than Vdd, instead of between the first and second supply voltages as in conventional sense amplifier latches. The control devices and the VREF generator are all driven by a single Set Sense Amplifier signal (SSA). In operation, both stages are alternatively selected by the SSA signal. As a result, when the SSA signal goes low, the master latch senses the selected bit line while the slave latch keeps the data previously sensed. When the SSA signal goes high, the new sensed data is latched into the master latch (which has become the +L1 LSSD latch), and is transferred through the slave latch (which is selected in driving mode) to the output terminal where the data out is available. The data remains valid in the master latch until the next SSA falling transition. In other words, one stage holds the previous data as long as the other one is working. In addition, a "Scan Data In" circuit to be combined with the master latch is also described.

Consequently, the combined sense amplifier and latching circuit of the present invention requires only one gating signal (SSA) for its operation. As a primary result, all the disadvantages mentioned above for the known sense amplifier and latch circuit combination of the prior art no longer exist.

The novel features believed to be characteristic of this invention are set forth in the appended claims. The invention itself, however, as well as other objects and advantages thereof, may best be understood by reference to the following detailed description of illustrated preferred embodiments, read in conjunction with the accompanying drawings in which:

DESCRIPTION OF THE PREFERRED EMBODIMENTS

Figure 1A:
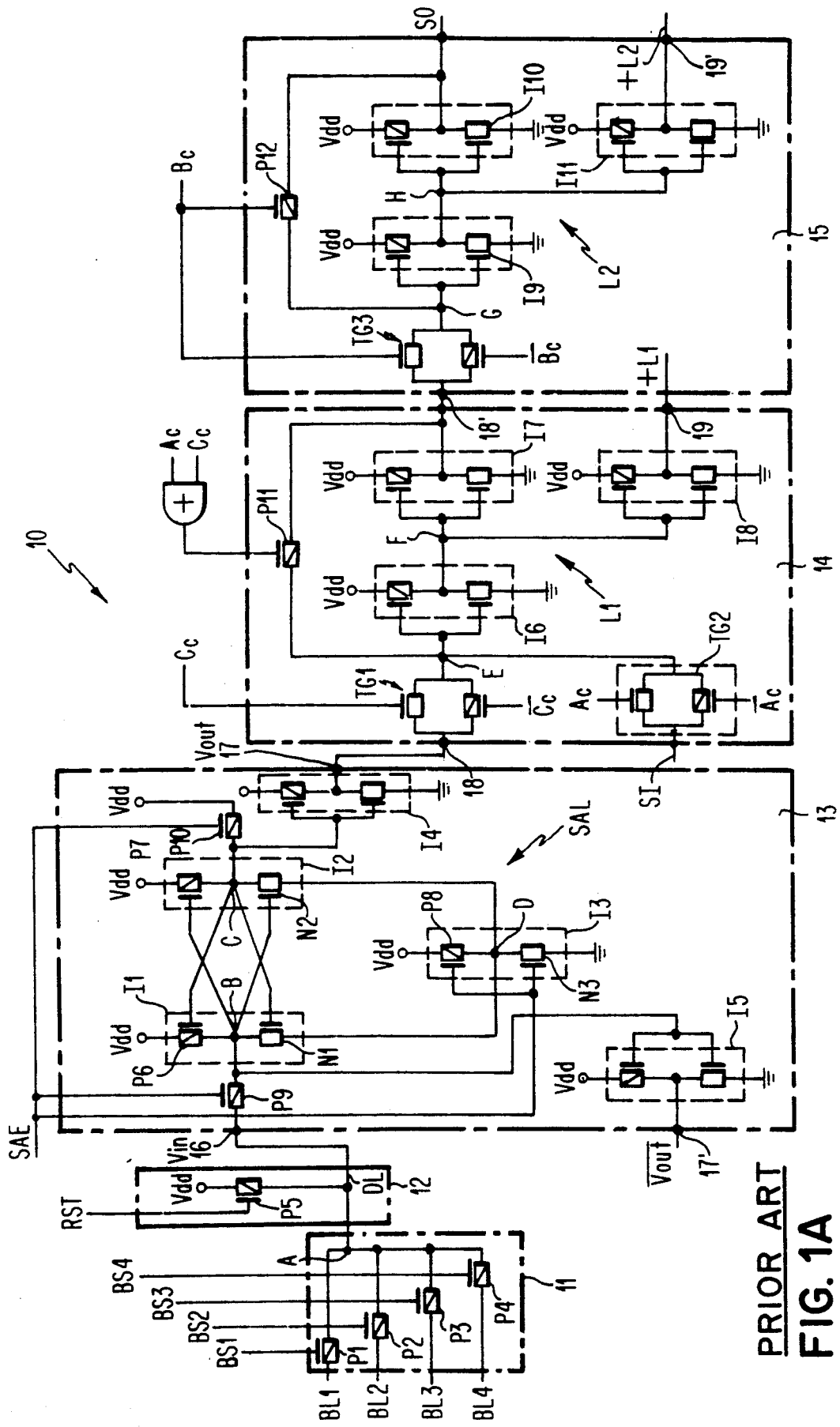
FIG. 1A illustrates a typical sensing circuit scheme of the prior art that complies with LSSD rules.
Figure 1B:
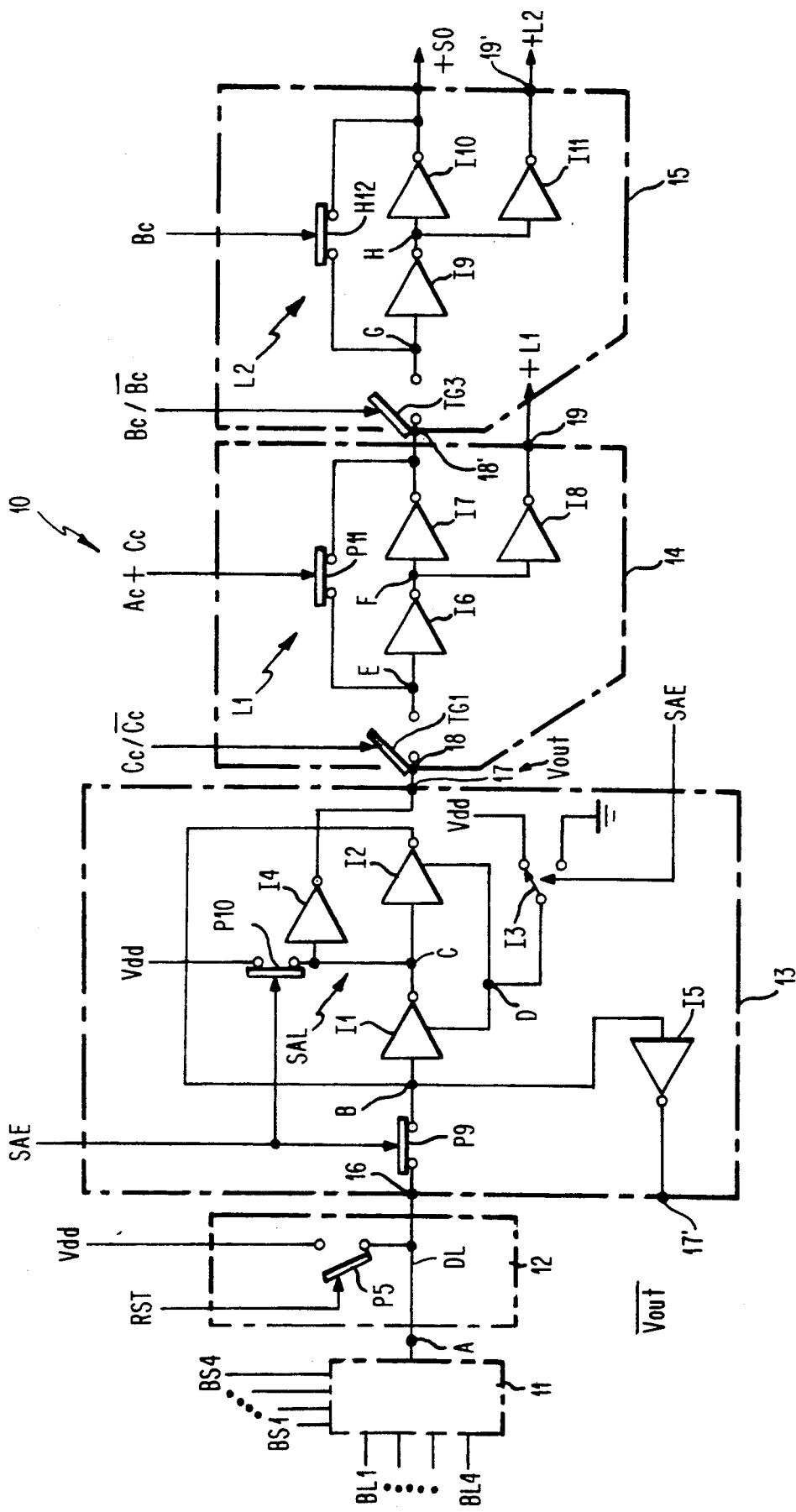
FIG. 1B illustrates a simplified representation of the circuit of FIG. 1A.
Figure 2C:
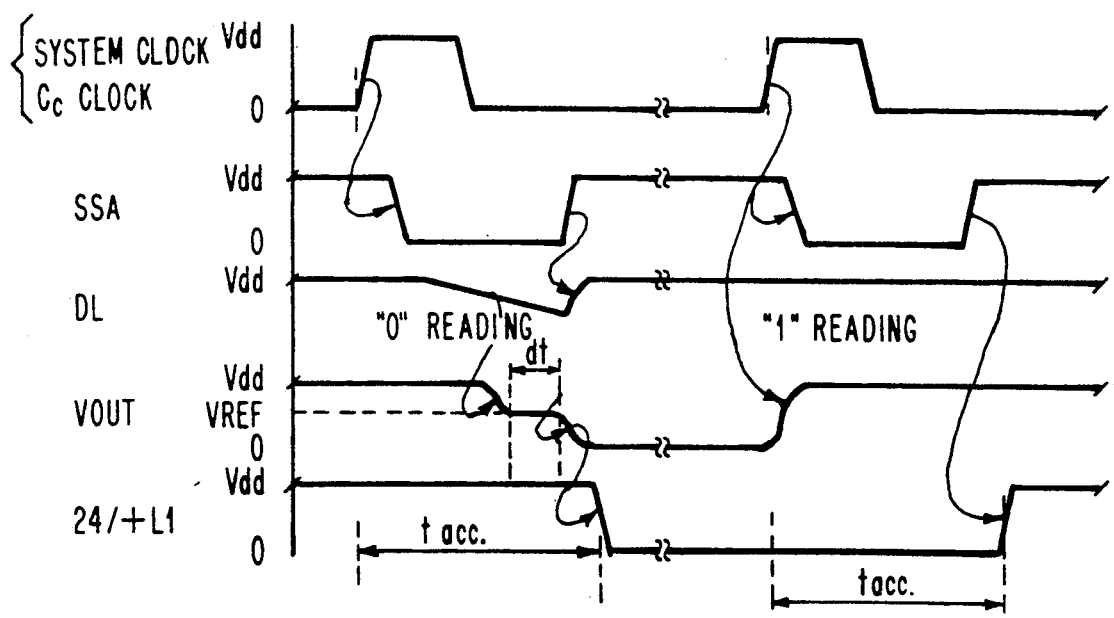
FIG. 2C illustrates waveforms at various nodes/terminals of the circuit of FIG. 2A.
Figure 1D:
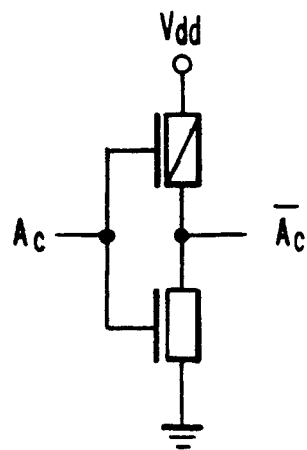
FIGS. 1D, 1E, and 1F illustrate clock circuits used with the circuit of FIG. 1A.
Figure 1E:
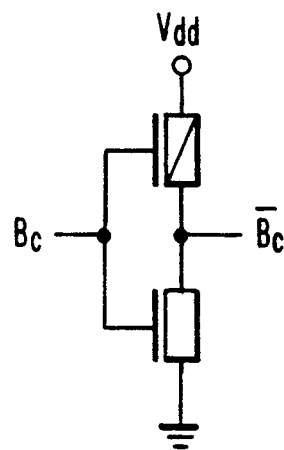
Figure 1F:
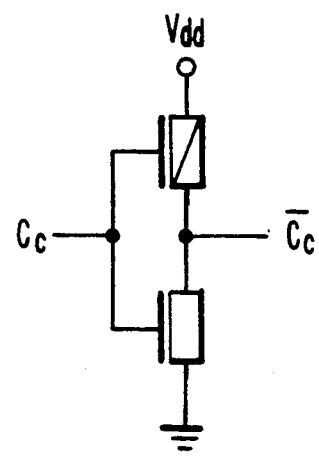
Figure 2D:
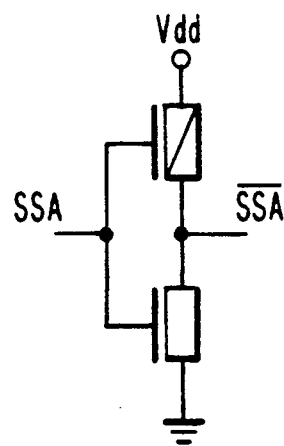
FIG. 2D illustrates a gating pulse circuit used with the circuit of FIG. 2A.
Figure 2E:
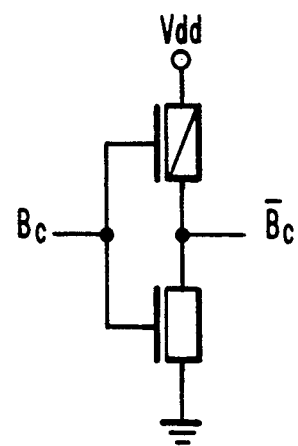
FIG. 2E illustrates a clock circuit used with the circuit of FIG. 2A.
Figure 2A:
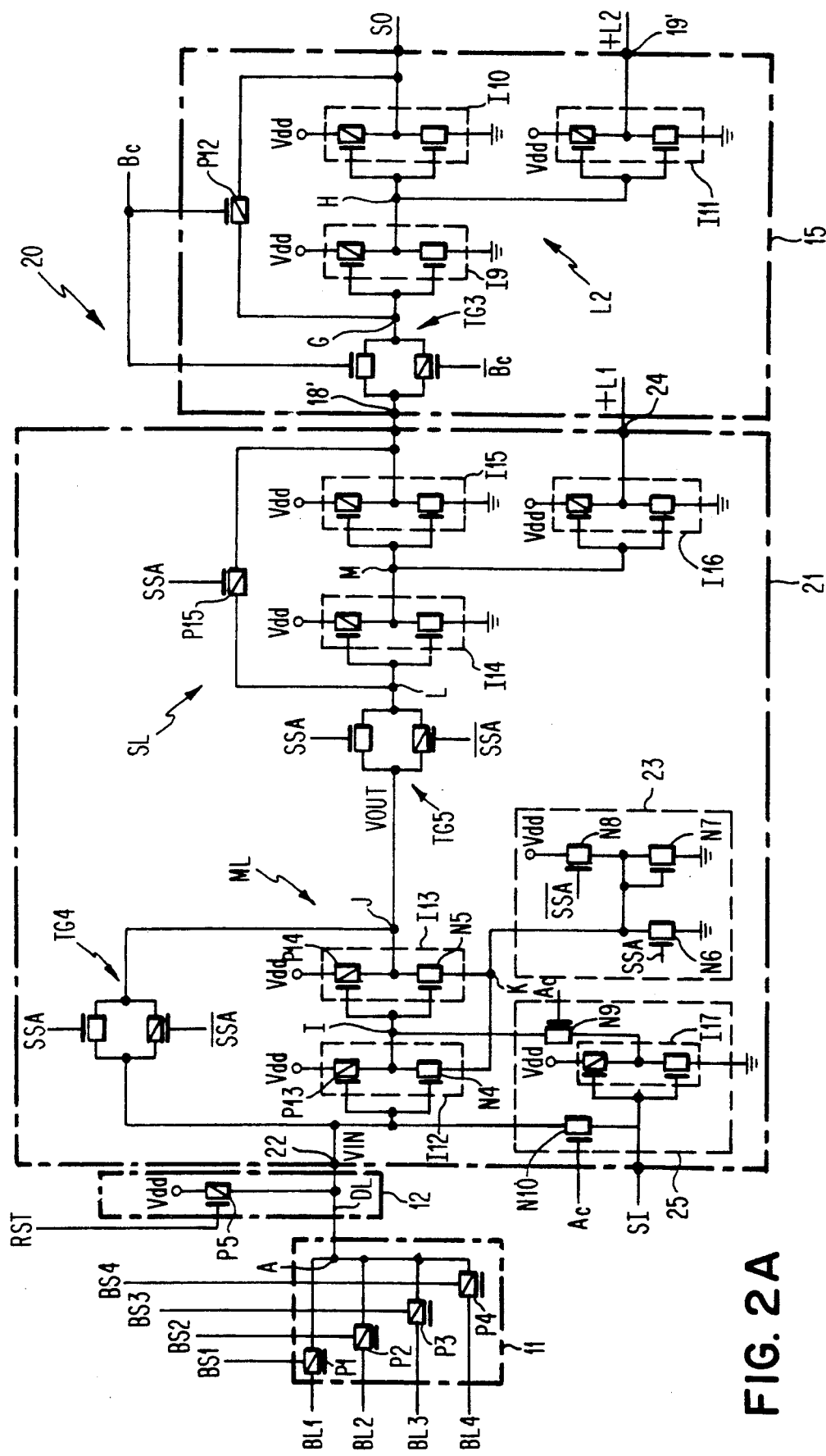
FIG. 2A illustrates the structure of the combined sense amplifier and latching circuit of the present invention in the context of the sensing circuit scheme of FIG. 1A.
Figure 2B:
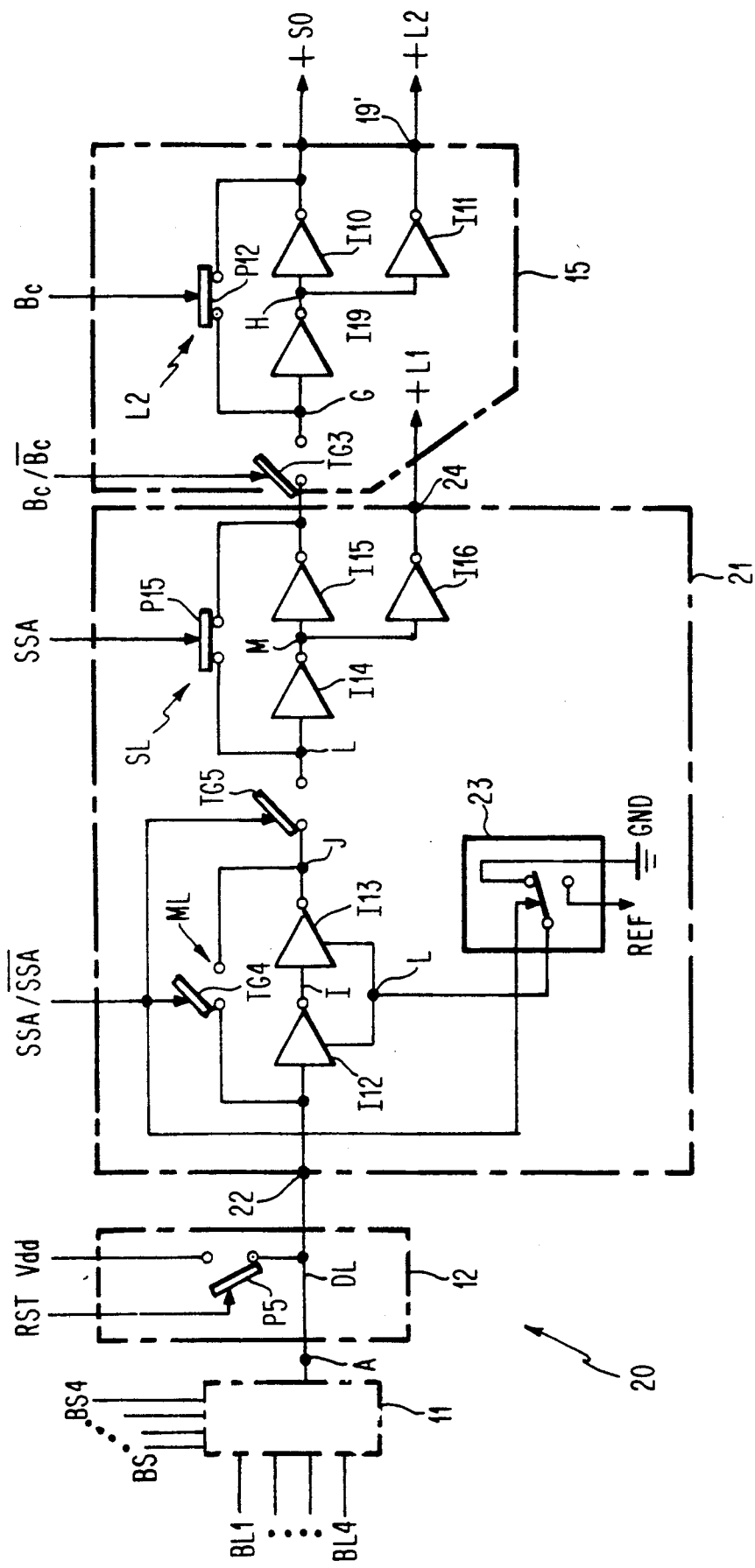
FIG. 2B illustrates a simplified representation of the circuit of FIG. 2A.

Now turning to FIG. 2A, circuit 20 aims to provide identical functions that are achieved by circuit 10 of FIG. 1A. In addition to the combined sense amplifier and latching circuit 21 of the present invention, circuit 20 includes the same multiplexer 11, restore circuit 12, and data out latch circuit 15 of FIG. 1A, so that the context of the sensing circuit scheme of FIG. 1A, in terms of functional operation, is maintained.

The combined sense amplifier and latching circuit 21 of the present invention basically includes two single-ended gated loop latches connected in series in a two stage configuration with a control device connected therebetween. Each latch has a control device in its loop.

The first stage forms the sense amplifier section of circuit 21. It includes a gated loop latch ML which consists of two inverters I12 and I13 connected in series with a control device in the loop. This control device includes a transmission gate TG4 controlled by complementary SSA/$\overline{SSA}$ gating signals (SSA stands for Set Sense Amplifier). The SSA signal is generated by the general set clock circuit (not shown) and plays a key role in the present circuit operation. Inverter I12 is formed by FET devices P13 and N4 while inverter I13 is formed by FET devices P14 and N5. The loop latch ML includes internal nodes I and J. The high noise immunity of the first stage is due to it being single-ended instead of the standard double-ended construction of circuit 10. The input signal VIN is applied to input terminal 22 of circuit 21. According to an essential feature of the invention, the gating circuit consists of a reference voltage (VREF) generator circuit 23 controlled by SSA/$\overline{SSA}$ gating signals connected to the common node K formed by the drains of NFETs N4 and N5. Circuit 23 comprises NFETs N6, N7 and N8. The output of circuit 23 can be switched from GND to VREF, depending on the state of the SSA signal. When the SSA signal is low, NFET N8 is ON, thus common node K is tied to VREF. When the SSA signal is high, common node K is grounded through NFET N6 which is passing. The value of VREF is, VREF=Vdd−VT (N8) but also depends somewhat on the resistance ratio of NFETs N7 and N8.

The second stage is of similar hardware construction with respect to the +L1 data out latch 14 of FIG. 1A, except for the gating/clocking signals. It comprises inverters I14 and I15, with a control device mounted in the loop, typically a PFET P15 whose gate electrode is controlled by the SSA signal. Preferably, an output driver formed by inverter I16 is connected to node M, so that circuit output signal +L1 is available at the circuit output terminal 24. The first and second stages are isolated from each other by a control device, typically a transmission gate TG5 controlled by the SSA/$\overline{SSA}$ gating signals.

Circuit 21 further includes a Scan Data In circuit. The Scan Data In circuit 25 comprises inverter I17 and NFETs N9 and N10 whose drain regions are respectively connected to node I of master latch ML and input terminal 22 of circuit 21. In circuit 25, only the Ac clock signal is used to drive NFETs N9 and N10 to gate the SI data into the master latch ML for LSSD purposes.

As is apparent from the comparison between circuits 10 and 20, the first latch L1 of circuit 14 in FIG. 1A is now included in circuit 21 and forms the second stage or slave section thereof. In circuit 10, transmission gate TG1 and PFET P11 are respectively controlled by clock signals Cc/$\overline{Cc}$ and Ac or Cc, while in circuit 20, transmission gate TG5 and PFET P15 are controlled by the main SSA/$\overline{SSA}$ signals.

It is an essential feature of the present invention that in READ mode, the master latch ML works between the logic level +Vdd and the reference level +VREF (lower than Vdd by construction) supplied by generator 23 instead of between Vdd and GND as practiced in the prior art circuit of FIG. 1A. Because one supply voltage of the master latch is switched from GND to +VREF, the master latch threshold voltage is moved up, therefore improving its set up time.

In standby mode, node K is grounded through NFET N6 and the VREF generator 23 is turned off by the SSA/$\overline{SSA}$ signals, reducing thereby the consumed power.

According to the broadest principle of the present invention, SSA/$\overline{SSA}$ gating signals are used to input the data of the sensed bit line into the master latch ML at one transition and into the slave latch at the other transition. Bc and $\overline{Bc}$ clock signals are used to transfer the data from latch L1 to latch L2 of circuit 15, as standard.

Electrical operation of the circuit of FIGS. 2A/2B during a READ operation is now given in conjunction with FIG. 2C which shows the waveforms at different nodes/terminals of circuit 20.

All bit lines have been restored to the high logic level (Vdd). Data line DL is pulsed high through PFET P5 by the RST signal to quickly restore the multiplexer 11. One bit line out of four (BL1 to BL4) is selected through the multiplexer 11 depending upon the state of control signals BS1 to BS4.

1. Assuming that previous data is "1" and the data to be read is "0" (VIN=OV). When the SSA signal drops to the low logic level (OV), the potential of the data line DL goes down from the logic level Vdd. Simultaneously, the VREF generator 23 is activated so that the reference level VREF moves up the threshold voltage of the master latch ML, which becomes powered between levels Vdd and +VREF, while the SSA signal cuts off transmission gate TG4. The master latch loop is then broken to allow easy writing of the data therein. Initially, FET devices P13 and N5 were OFF and FET devices P14 and N4 were ON. The potential of the data line DL continues to fall, and when the gate electrode potential of PFET P13 becomes more negative than its threshold voltage, then FET devices P13 and N5 turn ON. The IN PHASE or true signal (VOUT) then drops from Vdd to the reference voltage +VREF. In addition, the SSA signal going low also isolates the slave latch SL from the master latch ML, because PFET P15 in the latch SL loop is rendered passing and transmission gate TG5 is opened. Thus, the previous data stored in latch SL still stays latched therein as long as the SSA signal remains low.

After a short delay, the SSA signal goes up to the level Vdd and the master latch ML is now biased between GND and the level +Vdd. The VOUT signal is now at the GND potential and the "real" data "0" is stored in the master latch ML. Moreover, the SSA signal going high simultaneously connects the master latch ML to the latch SL and closes transmission gate TG5. PFET P15 is turned OFF, so that the loop of latch SL is now broken. The "0" is now transferred into the slave latch SL but is not latched therein (latching will occur at the next SSA signal drop). The data is available at circuit output terminal 24 through inverters I14 and I16, operating respectively as the preamplifier and the output buffer.

2. Assuming the data to be read is "1" (VIN=Vdd) and irrespective of the previous data, the potential of the data line DL stays high at level Vdd. When the SSA signal drops to the low logic level (OV), the VREF generator 23 is activated so that the reference level VREF moves up to the threshold voltage of the master latch ML, which becomes powered between levels Vdd and +VREF. As mentioned above, the master latch loop must be opened to allow easy writing of the data therein, therefore the SSA signal cuts off transmission gate TG4. Initially, FET devices P13 and N5 were OFF and FET devices P14 and N4 were ON after restoring. The IN PHASE or true signal (VOUT) then rises from OV to Vdd. Moreover, the SSA signal when low, isolates the slave latch SL from the master latch ML, because PFET P15 in loop of latch SL is rendered passing, and transmission gate TG5 is opened. Thus, the previous data stays in latch SL therein as long as the SSA signal remains low.

After a short delay, the SSA signal goes up to level Vdd and the master latch ML is now biased between GND and level Vdd. The VOUT signal remains at the Vdd potential and the "real" data "1" is stored in the master latch ML. On the other hand the SSA signal going high simultaneously connects the master latch ML to latch SL. The loop of latch SL is now opened, PFET P15 is turned OFF and transmission gate TG5 is closed. Thus, the "1" is now transferred into the slave latch SL but is not latched therein (latching will occur at the next SSA signal drop). The data is available at the circuit output terminal 24 though inverters I14 and I16, operating respectively as the preamplifier and the output buffer.

From FIG. 2C, it is clear that the access time (tacc.) between the transition of the system clock Cc to a positive slope and valid data appearing at latch output L1 is the same irrespective of whether the data to be read is "0" or a "1".

In conclusion, the combined sense amplifier and latching circuit 21 of the present invention can be used anywhere in the chip, because it is not impacted by the global wiring while still meeting the porosity requirements, i.e. a good noise immunity, without any impact on circuit performance. The basic choice of a single-ended gated-loop circuit has lead to the following features:

Circuit 21 is threshold adjustable by a clocked voltage reference (+VREF) generator. This is a major advantage over the traditional doubled-ended sense amplifier 13 of FIG. 1A, which does not include such a voltage reference generator.

In circuit 21, the noise immunity is given by the threshold voltage of the small FET devices which is equal to 1.2 volts compared to the 0.3 V exhibited by large devices of block 13 in circuit 10.

Moreover, in circuit 21, the master latch ML needs to have a rather low gain (around 3) when operating as a sense amplifier which further improves the noise immunity and therefore porosity. On the contrary, the sense amplifier 13 of circuit 10 needs a higher gain (of about 10) for good operation but at the cost of a low noise immunity.

A significant path delay improvement with respect to circuit 10 is obtained with circuit 21. When control device TG4 of the master latch loop is opened, master latch ML simply consists of two inverters in series (I12 and I13), which is a fast circuit structure. In addition, because the power supply of the master latch ML ranges between the first supply voltage (Vdd) and the reference voltage VREF (lower than Vdd), it may therefore operate with a very small voltage swing, contributing thereby to the speed increase. Finally, having the L1 latch combined with the master latch ML also reduces the overall delay.

Figure 1C:
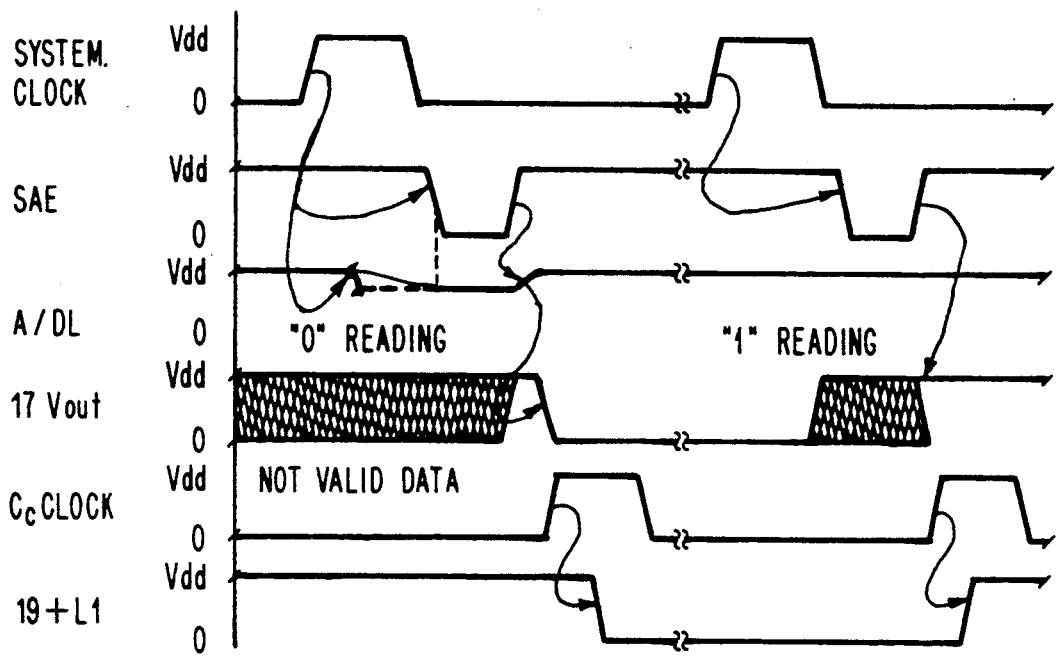
FIG. 1C illustrates waveforms at various nodes/terminals of the circuit of FIG. 1A.

In circuit 21, the system clock and Cc clock signals are merged in a single clock signal, as apparent from the comparison between the timing waveforms shown in FIG. 1C and FIG. 2C.

The combined sense amplifier and latching circuit 21 may find extensive application to the sensing of various memory arrays such as ROMs, RAMs, . . . etc.

We claim:

1. A combined sense amplifier and latching circuit (21) comprising:
   an input terminal (22) for receiving an input signal (VIN);
   a reference voltage generator (23) for generating a reference voltage (VREF);
   a first stage including a sense amplifier circuit having a gated-loop master latch (ML) having first and second cascaded inverters (I12, I13) with a first common node (I) coupled therebetween and a first control device (TG4) in the master latch loop controlled by a gating signal (SSA); said first and second inverters being biased between a first supply voltage (Vdd) having a magnitude greater than said reference voltage (VREF) and either a second supply voltage (GND) or said reference voltage (VREF) depending on the value of said gating signal (SSA); said input terminal being connected to the input of said first inverter;
   a second stage including a latching circuit connected in series with said first stage and having a gated-loop slave latch (SL) having third and fourth cascaded inverters (I14, I15) with a second common node (M) coupled therebetween and a second control device (P15) in the slave latch loop controlled by said gating signal (SSA); and,
   said first and second stages being isolated from each other by a third control device (TG5) controlled by said gating signal (SSA).

2. The circuit of claim 1 wherein said first and second inverters are formed by a pair of complementary PFET and NFET devices.

3. The circuit of claim 2 wherein said reference voltage generator (23) comprises three FET devices connected to a third common node (K) obtained by connecting one end of the NFETs from each of the first and second inverters.

4. The circuit of claim 3 wherein said three FET devices includes a NFET (N6), having one electrode connected to said second supply voltage (GND), and a gate electrode controlled by said gating signal (SSA);
   a NFET (N8), having one electrode connected to said first supply voltage (Vdd) and the gate electrode controlled by the complement of said gating signal (SSA); and,
   a resistively connected NFET (N7).

5. The circuit of claim 1 further including a Scan In generator circuit (25) having:

a fifth inverter (I17), having a pair of complementary FET devices having a common node coupled therebetween;

a NFET (N10) driven by a first clock signal (Ac) connected between said input terminal and a pair of gate electrodes from the FET devices included in said fifth inverter (I17); and, a NFET (N9) driven by said first clock signal (Ac) and connected between said first common node (I) and a common node in said fifth inverter (I17).

6. The circuit of claim 1 further comprising an output driver (I16) connected to said second common node (M) for supplying a circuit output signal (+L1) at a circuit output terminal (24).

7. A combined sense amplifier and latching circuit comprising:

an input terminal for receiving an input signal;
means for generating a gating signal;
a gated-loop master latch connected to said input terminal having a first control device in said master latch loop, said first control device being controlled by said gating signal; and
a gated-loop slave latch having a second control device in said slave latch loop, said second control device being controlled by said gating signal, said slave latch being alternately connected in series with and isolated from said master latch by a third control device controlled by said gating signal and
a reference voltage generator for supplying a reference voltage and wherein said master latch includes first and second cascaded inverters having a common node coupled therebetween, said first and second inverters being biased between a first supply voltage and a second supply voltage in a first mode of operation and between a first supply voltage and said reference voltage in a second mode of operation, said first and second modes of operation being controlled by the value of said gating signal, and the magnitude of said reference voltage being less than the magnitude of said first supply voltage.

8. The circuit of claim 7 further including a scanning circuit connected to said input terminal for gating scanned input data to said master latch.

9. The circuit of claim 7 further including an output terminal and an output driver circuit connected to said slave latch for supplying an output signal to said output terminal.

10. A circuit for sensing data contained in an integrated memory circuit comprising:

a multiplexer circuit for receiving data from said memory circuit and connecting data signals to an output node;
a restore circuit for restoring data at said output node to a high state;
an input terminal connected to said output node for receiving data signals therefrom;
means for generating a gating signal;
a gated-loop master latch connected to said input terminal having a first control device in said master latch loop, said first control device being controlled by said gating signal;
a gated-loop slave latch having a second control device in said slave latch loop, said second control device being controlled by said gating signal, said slave latch being alternately connected in series with and isolated from said master latch by a third control device controlled by said gating signal;
a slave latch output terminal and an output driver circuit connected to said slave latch for supplying an output signal to said slave latch output terminal;
a pair of output data terminals and an output data latch circuit connected to said slave latch output terminal for delivering output data to said output data terminals and,
a reference voltage generator for supplying a reference voltage and wherein said master latch includes first and second cascaded inverters having a common node coupled therebetween, said first and second inverters being biased between a first supply voltage and a second supply voltage in a first mode of operation and between a first supply voltage and said reference voltage in a second mode of operation, said first and second modes of operation being controlled by the value of said gating signal, and the magnitude of said reference voltage being less than the magnitude of said first supply voltage.

11. The circuit of claim 10 further including a scanning circuit connected to said input terminal for gating scanned input data to said master latch.

12. The circuit of claim 10 further including mean for supplying a clock signal and wherein said output data latch circuit is controlled by said clock signal.

* * * * *